United States Patent
Fujikawa et al.

(10) Patent No.: US 9,650,522 B2
(45) Date of Patent: May 16, 2017

(54) ABSORBING-LAYER-FORMING COMPOSITION AND ABSORBING SUBSTRATE, PRINTED ITEM, CONDUCTIVE PATTERN, AND ELECTRIC CIRCUIT PRODUCED USING THE SAME

(71) Applicant: DIC Corporation, Tokyo (JP)

(72) Inventors: Wataru Fujikawa, Osaka (JP); Jun Shirakami, Osaka (JP); Akira Murakawa, Osaka (JP); Yukie Saitou, Osaka (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/762,789

(22) PCT Filed: Jan. 16, 2014

(86) PCT No.: PCT/JP2014/050646
§ 371 (c)(1),
(2) Date: Jul. 22, 2015

(87) PCT Pub. No.: WO2014/115629
PCT Pub. Date: Jul. 31, 2014

(65) Prior Publication Data
US 2015/0353747 A1 Dec. 10, 2015

(30) Foreign Application Priority Data
Jan. 23, 2013 (JP) ................. 2013-010145

(51) Int. Cl.
*H05K 1/09* (2006.01)
*C09D 11/102* (2014.01)
*B41J 2/01* (2006.01)
*C09D 11/52* (2014.01)
*B41M 5/52* (2006.01)
*H05K 3/12* (2006.01)
*H05K 3/18* (2006.01)

(52) U.S. Cl.
CPC .............. *C09D 11/102* (2013.01); *B41J 2/01* (2013.01); *B41M 5/5263* (2013.01); *C09D 11/52* (2013.01); *H05K 1/092* (2013.01); *H05K 3/125* (2013.01); *H05K 3/1208* (2013.01); *H05K 3/182* (2013.01); *B32B 2307/202* (2013.01); *B32B 2307/4026* (2013.01); *B32B 2307/75* (2013.01); *B32B 2457/00* (2013.01); *B32B 2457/08* (2013.01); *B32B 2457/20* (2013.01); *H05K 2203/0709* (2013.01)

(58) Field of Classification Search
CPC .......... C09D 11/102; C09D 11/52; B41J 2/01; B41M 5/5263; H05K 1/092; H05K 3/1208; H05K 3/125; H05K 3/182
See application file for complete search history.

(56) References Cited

U.S. PATENT DOCUMENTS

| | | | |
|---|---|---|---|
| 2005/0282081 A1* | 12/2005 | Mori | ..................... B41C 1/1008 430/270.1 |
| 2007/0049493 A1* | 3/2007 | Mori | ..................... B41C 1/1016 503/226 |
| 2009/0075089 A1 | 3/2009 | Ohta et al. | |
| 2013/0220681 A1* | 8/2013 | Saitou | .................. B41M 5/5254 174/255 |

FOREIGN PATENT DOCUMENTS

| | | |
|---|---|---|
| JP | 09-169085 A | 6/1997 |
| JP | 2001-150804 A | 6/2001 |
| JP | 2009-49124 A | 3/2009 |
| TW | 200741030 A | 11/2007 |

OTHER PUBLICATIONS

International Search Report PCT/JP2014/050646 dated Apr. 8, 2014 with English translation.
Examination Opinion Letter Taiwanese Patent Application No. 103102003 dated May 5, 2015 with English translation.

* cited by examiner

*Primary Examiner* — Michael L Leonard
(74) *Attorney, Agent, or Firm* — McDermott Will & Emery LLP

(57) ABSTRACT

The present invention provides an absorbing-layer-forming composition including a blocked isocyanate such that the amount of the blocked isocyanate is 50% by mass to 100% by mass of the solid content of the absorbing-layer-forming composition and an absorbing substrate, a printed item, and a conductive pattern that are formed using the absorbing-layer-forming composition. The absorbing-layer-forming composition according to the present invention can be used for forming an absorbing layer which is capable of carrying a fluid such as an ink therein and which enables good adhesion between various types of supports and a conductive layer to be achieved. In particular, using a blocked isocyanate having a number-average molecular weight of 1,000 to 5,000 further increases the adhesion between various types of supports and the conductive layer.

4 Claims, No Drawings

ABSORBING-LAYER-FORMING COMPOSITION AND ABSORBING SUBSTRATE, PRINTED ITEM, CONDUCTIVE PATTERN, AND ELECTRIC CIRCUIT PRODUCED USING THE SAME

CROSS-REFERENCE TO RELATED APPLICATIONS

This application is the U.S. National Phase of PCT/JP2014/050646 filed Jan. 16, 2014, which claims priority to Japanese Patent Application No. 2013-010145 filed Jan. 23, 2013. The subject matter of each is incorporated herein by reference in entirety.

TECHNICAL FIELD

The present invention relates to a composition used for forming an absorbing layer capable of absorbing a fluid such as an ink, an absorbing substrate including such an absorbing layer formed using the composition, and a printed item such as a conductive pattern.

BACKGROUND ART

In the rapidly growing industries related to inkjet printing, there have been dramatic progresses in the improvement of the performance of inkjet printers and improvement of inks, which may soon make it possible to readily form high-definition, sharp images having good printability, which are comparable to silver halide photographs, even at home. Accordingly, inkjet printers have begun to be used not only at home but also in various fields such as the manufacture of large advertising boards.

The improvement of the image quality of inkjet-printed items is achieved through not only the improvement of the performances of the printers, but also the improvement of printing inks. Specifically, the improvement of a printing ink is achieved through, for example, studies of a selection of a solvent included in the ink, a selection of a dye or a pigment, and the like. Recently, attention has been focused on pigment inks, which are considered to have high color developability comparable to those of dye inks.

However, even when the pigment inks having high color developability are used, there are some cases where, for example, the pigments are peeled off from the support with time. In addition, while various materials have become used as a support on which the ink-absorbing layer is to be formed with an increase in the variety of inkjet-printed items, the ink-absorbing layers in the related art, which have insufficient adhesion to plastic films composed of polyethylene terephthalate or the like, may cause the absorbing layer to be peeled off with time.

Use of the printing methods known in the related art, such as the inkjet printing method described above and a screen printing method, in the manufacture of conductive patterns such as electronic circuits is being studied. This is because there has been a demand for high-performance, compact, thin electronic devices and accordingly there has also been a strong demand for electronic circuits and integrated circuits, which are used for producing such electronic devices, having a high density and a small thickness.

Specifically, the conductive pattern such as an electronic circuit can be produced by, for example, performing printing on the surface of a support using a conductive ink including a conductive substance such as silver by inkjet printing, screen printing, or the like, subsequently performing drying, and, as needed, performing heating or light irradiation.

However, even when printing is performed directly on the surface of a support using the conductive ink, the conductive ink, which is less likely to be adhered onto the surface of the support, may be easily peeled off, which results in, for example, breaking of wires of the final product such as an electronic circuit. In particular, while a flexible support composed of a polyimide resin, a polyethylene terephthalate resin, or the like enables bendable, flexible devices to be produced, such a support composed of a polyimide resin or the like, to which inks, resins, and the like are less likely to adhere, is likely to cause peeling to occur. This may result in breaking of wires of the final product such as an electronic circuit, which obstructs the passage of a current.

An example of known methods for addressing the above-described issues is a method in which a pattern is drawn on an ink-absorbing substrate including a latex layer disposed thereon using a conductive ink by a predetermined method in order to prepare a conductive pattern. It is known that the latex layer can be a urethane resin (e.g., see PTL 1).

However, the adhesion of the ink-absorbing layer constituting the conductive pattern, which is a latex layer, is only one step away from a level at which the conductive pattern can be used for producing electric circuits or the like.

In formation of the conductive pattern, generally, conductive substances included in the conductive ink are brought into contact with one another in order to impart electrical conductivity. Therefore, a printed item prepared by performing printing using the conductive ink is commonly fired by being heating at about 80° C. or more.

However, an ink-absorbing layer such as the latex layer described in PTL 1 above is likely to be, for example, degraded due to the heat received during the firing process. In particular, the adhesion at the interface between the ink-absorbing layer and the support is likely to be reduced, and consequently peeling may occur easily even when a small force is applied thereto.

In addition, excessive swelling, deformation, or the like of the latex layer, which serves as an ink-absorbing layer, may occur during the firing process, which results in breaking of wires or poor electric conduction of an electric circuit or the like. Furthermore, peeling may partially occur between the support and the ink-absorbing layer prior to the firing process because, in many cases, the latex layer does not have sufficient adhesion to the support before heating is performed in the firing process.

In formation of the conductive pattern, plating is commonly performed on the surface of the conductive pattern using copper or the like in order to form a high-reliability wiring pattern capable of maintaining good electrical conductivity over a prolonged period of time without, for example, causing wires to be broken.

However, plating chemicals used for plating and chemicals used in the subsequent cleaning process, which are generally strongly alkaline or strongly acidic, are likely to cause, for example, the absorbing layer or the like to be peeled off from the support, which may result in breaking of wires of a conductive pattern.

Accordingly, the conductive pattern requires high durability such that, for example, a conductive-ink-absorbing layer is not peeled off from a support even when, for example, repeatedly immersed in the above-described chemical or the like for a prolonged period of time.

CITATION LIST

Patent Literature

PTL 1: Japanese Unexamined Patent Application Publication No. 2009-49124

SUMMARY OF INVENTION

Technical Problem

An object of the present invention is to provide an absorbing-layer-forming composition capable of forming an absorbing layer which is capable of carrying a fluid such as an ink therein and which enables good adhesion between various types of supports and a conductive layer to be achieved.

A second object of the present invention is to provide an absorbing-layer-forming composition capable of forming a printed item such as a conductive pattern which is capable of carrying a fluid such as conductive ink therein and which has high durability such that an absorbing layer is not peeled off from a support even when a chemical such as a plating chemical or an organic solvent is adhered thereto.

Solution to Problem

The inventors of the present invention have conducted studies in order to address the above-described issues, and, as a result, found that an absorbing-layer-forming composition including a specific amount of blocked isocyanate (A) may address the issues of the present invention.

Specifically, the present invention relates to an absorbing-layer-forming composition including a blocked isocyanate (A) such that the amount of the blocked isocyanate (A) is 50% by mass to 100% by mass of the solid content of the absorbing-layer-forming composition.

Advantageous Effects of Invention

The absorbing-layer-forming composition according to the present invention, which has good adhesion to various types of supports, may be used for producing a record medium used for manufacturing indoor/outdoor advertisements, advertising boards, signs, and the like.

The absorbing-layer-forming composition according to the present invention, which enables an absorbing layer having good adhesion to various types of supports and high durability such that, for example, the absorbing layer is not peeled off even during a plating process or the like to be formed, can be generally used in novel fields such as printed electronics, that is, for example: formation of electronic circuits using, for example, a conductive ink containing a conductive substance such as silver; formation of layers constituting organic solar batteries, electronic book readers, organic ELs, organic transistors, flexible printed substrates, RFIDs such as non-contact IC cards, or the like and their peripheral wires; and manufacture of wires of electromagnetic shielding of a plasma display, integrated circuits, organic transistors, and the like.

DESCRIPTION OF EMBODIMENTS

An absorbing-layer-forming composition according to the present invention includes a blocked isocyanate (A) such that the amount of the blocked isocyanate (A) is 50% by mass to 100% by mass of the solid content of the absorbing-layer-forming composition. The absorbing-layer-forming composition can be used mainly for forming an absorbing layer, which absorbs a solvent of a fluid including a conductive substance, a pigment, or the like which is brought into contact with the absorbing layer and thereby carries the conductive substance or pigment thereon. The blocked isocyanate (A) enables an absorbing layer to be formed due to uretdione linkages formed by a self-reaction of isocyanate groups or due to linkages formed between the isocyanate groups and functional groups included in another component. The linkages may be formed prior to the application of the fluid. The linkages are not necessarily formed prior to the application of the fluid and may alternatively be formed by performing heating or the like subsequent to the application of the fluid.

The blocked isocyanate (A) included in the absorbing-layer-forming composition may include a functional group [a] formed by blocking an isocyanate group with a blocking agent.

The content of the functional group [a] in the blocked isocyanate (A) is preferably 350 g/mol to 600 g/mol per mole of the blocked isocyanate (A) in order to further increase adhesion to a support or a conductive layer.

The number of the functional groups [a] included per molecule of the blocked isocyanate (A) is preferably 1 to 10 and is more preferably 2 to 5 in order to further increase the adhesion.

The number-average molecular weight of the blocked isocyanate (A) is preferably 1,000 to 5,000 and is more preferably 1,500 to 3,000 in order to further increase the adhesion.

The blocked isocyanate (A) preferably includes an aromatic structure in order to further increase adhesion. Examples of the aromatic structure include a phenyl group and a naphthyl group.

The blocked isocyanate (A) may include a urethane linkage or a urea linkage. The proportion of the urethane linkage or urea linkage is preferably 500 g/mol to 1,500 g/mol per mole of the blocked isocyanate (A) in order to further increase adhesion.

The blocked isocyanate (A) can be produced by reacting some or all of the isocyanate groups of an isocyanate compound (a-1) with a blocking agent.

The isocyanate compound (a-1) that can be used for preparing the blocked isocyanate (A) may be a compound including an isocyanate group. Examples of such a compound include polyisocyanate compounds including an aromatic structure, such as 4,4'-diphenylmethane diisocyanate, 2,4'-diphenylmethane diisocyanate, carbodiimide-modified diphenylmethane diisocyanate, crude diphenylmethane diisocyanate, phenylene diisocyanate, tolylene diisocyanate, and naphthalene diisocyanate; aliphatic polyisocyanate compounds such as hexamethylene diisocyanate, lysine diisocyanate, cyclohexane diisocyanate, isophorone diisocyanate, dicyclohexylmethane diisocyanate, xylylene diisocyanate, and tetramethylxylylene diisocyanate; a polyisocyanate compound (a-1-1) including an alicyclic structure; and biurets, isocyanurates, and adducts of the above-described compounds.

The isocyanate compound (a-1) may also be a compound produced by reacting the polyisocyanate compound (a-1-1) with, for example, a compound including a hydroxyl group or an amino group.

The compound including a hydroxyl group is preferably a compound including a hydrophilic group and a hydroxyl group in order to further increase the adhesion of the blocked isocyanate (A). In the case where the blocked isocyanate (A)

is used in combination with an aqueous medium (B), using the compound including a hydrophilic group and a hydroxyl group advantageously increases the water dispersion stability of the blocked isocyanate (A).

Examples of the compound including a hydrophilic group and a hydroxyl group include polyols including a carboxyl group, such as 2,2-dimethylolpropionic acid, 2,2-dimethylolbutanoic acid, and 2,2-dimethylolvaleric acid; and polyols including a sulfonic group, such as 5-sulfoisophthalic acid, sulfoterephthalic acid, 4-sulfophthalic acid, and 5-(4-sulfophenoxy)isophthalic acid.

Examples of the compound including a hydrophilic group and a hydroxyl group include compounds including a non-ionic group, such as polyethylene glycol, a polyethylene-polypropylene copolymer, polyethylene glycol monomethyl ether, polyethylene glycol monoethyl ether, polyethylene glycol monopropyl ether, and polyethylene glycol monobutyl ether.

The compound including an amino group may be a compound including a hydrophilic group and an amino group, such as 2-aminopropionic acid, 2-aminoethylsulfonic acid, 4-aminobenzenesulfonic acid, 2,6-diaminohexanoic acid, or 2,5-diaminovaleric acid.

The isocyanate compound (a-1) is preferably a polyisocyanate compound including an aromatic structure in order to introduce an aromatic structure into the blocked polyisocyanate (A) and thereby further increase the adhesion. In particular, 4,4'-diphenylmethane diisocyanate, tolylene diisocyanate, an isocyanurate of 4,4'-diphenylmethane diisocyanate, and an isocyanurate of tolylene diisocyanate are more preferably used.

Examples of the blocking agent that can be used for preparing the blocked isocyanate (A) include phenol compounds such as phenol and cresol; lactams such as ε-caprolactam, δ-valerolactam, and γ-butyrolactam; oximes such as formamide oxime, acetaldo oxime, acetone oxime, methyl ethyl ketoxime, methyl isobutyl ketoxime, and cyclohexanone oxime; 2-hydroxypyridine; butyl cellosolve; propylene glycol monomethyl ether; benzyl alcohol; methanol; ethanol; n-butanol; isobutanol; dimethyl malonate; diethyl malonate; methyl acetoacetate; ethyl acetoacetate; acetylacetone; butyl mercaptan; dodecyl mercaptan; acetanilide; acetic acid amide; succinic acid imide; maleic acid imide; imidazole; 2-methylimidazole; urea; thiourea; ethylene urea; diphenylaniline; aniline; carbazole; ethylenimine; polyethyleneimine; 1H-pyrazole; 3-methylpyrazole; and 3,5-dimethylpyrazole. In particular, it is preferable to use a blocking agent that can be dissociated when heated preferably at 70° C. to 200° C. and more preferably at 110° C. to 180° C. and thereby causes an isocyanate group to be formed. It is more preferable to use any one of the above-described phenol compounds, lactams, and oximes.

The blocked isocyanate (A) may be prepared by mixing the isocyanate compound (a-1), which has been prepared in advance, with the blocking agent and thereby causing a reaction. Alternatively, the blocked isocyanate (A) may also be prepared by mixing the blocking agent with raw materials used for preparing the isocyanate compound (a-1) and thereby causing a reaction.

More specifically, the blocked isocyanate (A) used in the present invention may be prepared in the following manner. The polyisocyanate compound (a-1-1) is reacted with a compound including a hydroxyl group or an amino group to prepare an isocyanate compound (a-1) including an isocyanate group at the terminal. The isocyanate compound (a-1) is mixed with the blocking agent to cause a reaction.

The amount of the blocked isocyanate (A) prepared by the above-described method is preferably 50% by mass to 100% by mass and is more preferably 70% by mass to 100% by mass of the total solid content of the absorbing-layer-forming composition according to the present invention.

The absorbing-layer-forming composition according to the present invention may include a solvent in which the solid component of the blocked isocyanate (A) and the like can be dissolved or dispersed.

Examples of the solvent include an aqueous medium (B) and an organic solvent.

Examples of the aqueous medium (B) include water, organic solvents miscible with water, and a mixture of water and such an organic solvent. Examples of the organic solvents miscible with water include alcohols such as methanol, n-propanol, and isopropanol; ketones such as acetone and methyl ethyl ketone; polyalkylene glycols such as ethylene glycol, diethylene glycol, and propylene glycol; alkyl ethers of a polyalkylene glycol; and lactams such as N-methyl-2-pyrrolidone. In the present invention, the aqueous medium (B) may be water alone. Alternatively, a mixture of water and an organic solvent miscible with water may also be used. In another case, an organic solvent miscible with water may also be used alone. It is preferable to use water alone or a mixture of water and an organic solvent miscible with water and is particularly preferable to use water alone from the viewpoints of safety and environmental load.

Examples of the organic solvent that can be used as a solvent include toluene, ethyl acetate, and methyl ethyl ketone.

The absorbing-layer-forming composition according to the present invention preferably includes the aqueous medium (B) as a solvent of the blocked isocyanate (A). The aqueous medium (B) may be water alone or a mixture of water and an organic solvent miscible with water.

The amount of the aqueous medium (B) is preferably 60% by mass to 99% by mass and is preferably 70% by mass to 99% by mass of the total amount of the absorbing-layer-forming composition according to the present invention. Accordingly, the solid content of the absorbing-layer-forming composition according to the present invention is preferably 1% by mass to 40% by mass and is more preferably 1% by mass to 30% by mass of the total amount of the absorbing-layer-forming composition.

In the case where the solvent is the aqueous medium (B), in particular, the blocked isocyanate (A) may be, for example, a blocked isocyanate including a hydrophilic group in order to enhance the water dispersion stability and preservation stability of the blocked isocyanate (A). Alternatively, a surfactant may be used in combination.

Examples of the hydrophilic group include anionic groups, cationic groups, and nonionic groups. Anionic groups are more preferably used.

Examples of the anionic groups include a carboxyl group, a carboxylate group, a sulfonic group, and a sulfonate group. In particular, a carboxylate group and a sulfonate group formed by neutralizing some or all of the carboxyl groups or sulfonic groups with a basic compound are preferably used in order to enhance water dispersion stability.

Examples of the basic compound that can be used for neutralizing the anionic groups include organic amines such as ammonia, triethylamine, pyridine, and morpholine; alkanolamines such as monoethanolamine; and metal basic compounds containing sodium, potassium, lithium, or calcium. In the case where a conductive pattern or the like is formed, the organic amines and alkanolamines are preferably used because the metal basic compounds may deteriorate electrical conductivity and the like.

In the case where the anionic group is any one of the above-described carboxylate groups and sulfonate groups, the proportion of such an anionic group is preferably 5 mmol/kg to 4,000 mmol/kg and is more preferably 50 mmol/kg to 2,000 mmol/kg relative to the total amount of the blocked isocyanate (A) in order to maintain good water dispersion stability of the blocked isocyanate (A).

The cationic group may be, for example, a tertiary amino group.

Examples of an acid that can be used for neutralizing some or all of the tertiary amino groups include organic acids such as acetic acid, propionic acid, lactic acid, and maleic acid; organic sulfonic acids such as sulfonic acid and methanesulfonic acid; and inorganic acids such as hydrochloric acid, sulfuric acid, orthophosphoric acid, and orthophosphorus acid. These acids may be used alone or in combination of two or more. In the case where a conductive pattern or the like is formed, acetic acid, propionic acid, lactic acid, maleic acid, and the like are preferably used because chlorine and sulfur may deteriorate electrical conductivity and the like.

Examples of the nonionic groups include polyoxyalkylene groups such as a polyoxyethylene group, a polyoxypropylene group, a polyoxybutylene group, a poly(oxyethylene-oxypropylene) group, and a polyoxyethylene-polyoxypropylene group. In particular, a polyoxyalkylene group including an oxyethylene unit is preferably used in order to further enhance hydrophilicity.

The above-described hydrophilic group can be introduced into the blocked polyisocyanate (A) by reacting any one of the above-described compounds including a hydrophilic group and a hydroxyl group, such as 2,2-dimethylolpropionic acid, with the isocyanate compound (a1-1) in the preparation of the blocked isocyanate (A).

Examples of the surfactant that can be used for imparting water dispersion stability or the like to the blocked isocyanate (A) include an anionic surfactant, a nonionic surfactant, a cationic surfactant, and an amphoteric surfactant.

Examples of the anionic surfactant include a sulfuric acid ester of a higher alcohol, salts thereof, alkylbenzene sulfonic acid salts, polyoxyethylene alkylphenylsulfonic acid salts, polyoxyethylene alkyldiphenyl ether sulfonic acid salts, sulfuric acid half-ester salts of a polyoxyethylene alkyl ether, alkyl diphenyl ether disulfonic acid salts, and succinic acid dialkyl ester sulfonic acid salts. Examples of the nonionic surfactant include polyoxyethylene alkyl ether, polyoxyethylene alkylphenyl ether, polyoxyethylene diphenyl ether, a polyoxyethylene-polyoxypropylene block copolymer, and acetylene-diol-based surfactants.

Examples of the cationic surfactant include alkyl ammonium salts.

Examples of the amphoteric surfactant include alkyl (amide) betaine and alkyldimethylamine oxide.

Examples of surfactants other than the above-described surfactants include fluorine-based surfactants and silicone-based surfactants.

The absorbing-layer-forming composition according to the present invention may further include additional compounds other than the blocked isocyanate (A), such as a resin, a curing agent, a filler, a pH adjuster, a coating-film-forming aid, a leveling agent, a thickener, a water repellent, and an antifoaming agent, as needed, which constitute the solid component.

A resin is preferably used in order to further enhance printability and fine-line formability particularly in the case where an aqueous pigment ink, a conductive ink, or a plating-core agent is used as a fluid.

Examples of the resin include vinyl resins such as an acrylic resin, a urethane resin, a urethane-vinyl composite resin, a polyester resin, an imide resin, an epoxy resin, polyvinyl alcohol, polyvinylpyrrolidone, polyvinyl acetal, polyalkylene oxide, starch, cellulose derivatives such as methylcellulose, hydroxycellulose, hydroxypropylcellulose, hydroxypropylmethylcellulose, and carboxymethylcellulose, polyethyleneimine, polyamide, various types of water-soluble resins containing a quaternary-ammonium-salt group, and modified products of the above-described resins.

The curing agent may be a compound including a functional group capable of reacting with the isocyanate group, which is produced due to the dissociation of the blocking agent which is caused by heating or the like. Examples of such a compound include compounds capable of reacting at a relatively low temperature of about 25° C. to less than 100° C. to form a crosslinked structure, such as acryl polyol, polyester polyol, polyether polyol, polycarbonate polyol, polyols having a relatively low molecular weight (e.g., ethylene glycol, diethylene glycol, triethylene glycol, propylene glycol, 1,3-propanediol, 1,3-butanediol, 1,4-butanediol, hexamethylene glycol, saccharose, methylene glycol, glycerin, and sorbitol), metal chelate compounds, polyamine compounds, aziridine compounds, and metal salt compounds; and compounds capable of reacting at a relatively high temperature of 100° C. or more to form a crosslinked structure, such as melamine-based compounds, epoxy-based compounds, oxazoline compounds, and carbodiimide compounds.

Examples of the additional compounds also include various types of fillers such as inorganic particles. However, the amount of the filler or the like added to the absorbing-layer-forming composition according to the present invention is preferably as small as possible and is more preferably 5% by mass or less of the total amount of the absorbing-layer-forming composition according to the present invention.

The amount of the additional compounds used is preferably 0% by mass to 50% by mass and is more preferably 0% by mass to 30% by mass of the solid content of the absorbing-layer-forming composition.

The above-described absorbing-layer-forming composition can be used for forming a swelling-type absorbing layer, which is capable of absorbing a solvent contained in a fluid such as an ink, in which the blocked polyisocyanate (A) constituting the absorbing layer or the cured product of the blocked polyisocyanate (A) is dissolved to an adequate degree, and thereby enables a conductive substance such as a metal or a pigment included in the fluid to fix onto the surface of the absorbing layer with high accuracy. This enables a printed item such as a conductive pattern to be produced without causing bleeding. The absorbing-layer-forming composition according to the present invention is also capable of forming an absorbing layer having a higher degree of transparency than the porous-type absorbing layer of the related art.

A substrate capable of absorbing the above-described fluid according to the present invention is described below.

The absorbing substrate according to the present invention includes a support and an absorbing layer disposed on a part or the entirety of one or both surfaces of the support. The absorbing layer is formed using the above-described absorbing-layer-forming composition.

The absorbing layer, for example, absorbs a solvent included in the above-described fluid that is brought into contact with the surface of the absorbing layer and thereby carries a conductive substance or a pigment on the surface of the absorbing layer. For example, in the case where the fluid is a pigment ink, a high-definition printed item can be formed without causing bleeding and the like. In the case where the fluid is a conductive ink, a conductive pattern can be formed without causing bleeding and the like. In the case where the fluid is a plating-core agent, a laminated body including a plating core that is evenly and uniformly deposited on the surface of the absorbing layer can be formed.

The absorbing layer may be stacked on the support. Alternatively, the support may be impregnated with a part of the absorbing layer.

The absorbing substrate according to the present invention may be prepared by applying the absorbing-layer-forming composition onto a part or the entirety of one or both surfaces of the support and volatilizing an aqueous medium (B) included in the coated surface. In the case where the support is a fibrous substrate, alternatively, the absorbing substrate according to the present invention may be prepared by impregnating the support with the absorbing-layer-forming composition and subsequently volatilizing the aqueous medium (B).

Examples of the support include supports composed of a high-quality paper, a coated paper, a polyimide resin, a polyamide-imide resin, a polyamide resin, polyethylene terephthalate, polyethylene naphthalate, polycarbonate, acrylonitrile-butadiene-styrene (ABS), acrylic resins such as polymethyl(meth)acrylate, polyvinylidene fluoride, polyvinyl chloride, polyvinylidene chloride, polyvinyl alcohol, polyethylene, polypropylene, polyurethane, cellulose nanofiber, silicon, a ceramic, or glass; porous supports composed of any one of the above-described materials; a steel sheet; and supports made of a metal such as copper.

The support may also be a substrate composed of synthesis fibers such as polyester fibers, polyamide fibers, or aramid fibers; or natural fibers such as cotton or hemp. These fibers may optionally be subjected to a pretreatment.

The support can be coated or impregnated with the absorbing-layer-forming composition by any publicly known method such as a gravure method, a coating method, a screen method, a roller method, a rotary method, or a spray method.

After a part or the entirety of one or both surfaces of the support is coated or impregnated with the absorbing-layer-forming composition according to the present invention, a solvent that may be included in the composition can be removed generally by, for example, drying with a dryer. However, the method for removing the solvent is not particularly limited. The drying temperature may be set to any temperature at which the solvent can be volatilized and the support is not adversely affected. In the case where linkages are to be formed subsequent to the application of the fluid, drying is preferably performed at a temperature that does not cause the blocking agent to be dissociated and an isocyanate group to be formed.

The amount of the absorbing-layer-forming composition deposited on the support is preferably 3 g/m$^2$ to 60 g/m$^2$ per area of the support in order to maintain color developability at a considerably high level and high production efficiency and is particularly preferably 20 g/m$^2$ to 40 g/m$^2$ in consideration of capability of absorbing a solvent included in the fluid and the production cost.

Increasing the amount of the absorbing-layer-forming composition deposited on the support further enhances the color developability of a printed item. However, when the amount of the composition deposited is increased, the feeling of the printed item may become slightly hard. Thus, the amount of the absorbing-layer-forming composition deposited on the support is preferably controlled appropriately depending on, for example, the use of the printed item.

Thus, the absorbing substrate according to the present invention enables a printed image having good printability and high water resistance to be formed without causing bleeding nor cracking. Thus, the absorbing substrate according to the present invention can be used for indoor/outdoor advertising such as board advertising, transit advertising, and banner advertising.

The fluid that can be used for printing on the absorbing substrate is a liquid or a viscous liquid having a viscosity of 0.1 mPa·s to 500,000 mPa·s and preferably having a viscosity of 0.5 mPa·s to 10,000 mPa·s as measured using a Brookfield viscometer at about 25° C. which includes a solvent in which a conductive substance, a pigment, or the like is, for example, dispersed. In the case where printing or the like is performed using the fluid by inkjet printing, the viscosity of the fluid is preferably 0.5 mPa·s to 10000 mPa·s.

Specific examples of the fluid include printing inks such as a conductive ink and a pigment ink; and plating-core agents that may be used in the case where plating is performed.

An example of the fluid is an aqueous pigment ink including an aqueous medium in which a pigment is, for example, dispersed.

The aqueous medium may be water alone or alternatively be a mixed solution of water and a water-soluble solvent. Examples of the water-soluble solvent include alcohols such as methyl alcohol, ethyl alcohol, isopropyl alcohol, ethyl carbitol, ethyl cellosolve, and butyl cellosolve; and polar solvents such as N-methylpyrrolidone.

Examples of the pigment capable of being dispersed or dissolved in the aqueous medium include a quinacridone-based organic pigment, an anthraquinone-based organic pigment, a perylene-based organic pigment, a perinone-based organic pigment, a diketopyrrolopyrrole-based organic pigment, an isoindolinone-based organic pigment, a condensed azo-based organic pigment, benzimidazolone-based organic pigment, a monoazo-based organic pigment, an insoluble-azo-based organic pigment, a naphthol-based organic pigment, a flavanthrone-based organic pigment, an anthrapyrimidine-based organic pigment, a quinophthalone-based organic pigment, a pyranthrone-based organic pigment, a pyrazolone-based organic pigment, a thioindigo-based organic pigment, an anthanthrone-based organic pigment, a dioxazine-based organic pigment, a phthalocyanine-based organic pigment, and an indanthrone-based organic pigment; metal complexes such as nickel dioxine yellow and copper azomethine yellow; metal oxides such as titanium oxide, iron oxide, and zinc oxide; metal salts such as barium sulfate and calcium carbonate; inorganic pigments such as carbon black and mica; fine metal powders such as an aluminium powder; and a fine mica powder. The amount of the pigment is preferably 0.5% by mass to 15% by mass and is more preferably 1% by mass to 10% by mass of the total amount of the aqueous pigment ink.

Alternatively, the fluid may also be a solvent-based pigment ink, which includes an organic solvent in which a pigment or the like is dissolved or dispersed.

The organic solvent is preferably an alcohol, an ether, an ester, a ketone, or the like having a boiling point of 100° C. to 250° C. in order to prevent drying, clogging, and the like of an inkjet head from occurring. The boiling point of the organic solvent is more preferably 120° C. to 220° C.

Examples of the alcohol include ethylene glycol, triethylene glycol, tetraethylene glycol, propylene glycol, and dipropylene glycol.

Examples of the ether include ethylene glycol mono (methyl, ethyl, butyl, phenyl, benzyl, or ethylhexyl) ether, ethylene glycol di(methyl, ethyl, or butyl) ether, diethylene glycol mono(methyl, ethyl, or butyl) ether, diethylene glycol di(methyl, ethyl, or butyl) ether, tetraethylene glycol mono (methyl, ethyl, or butyl) ether, tetraethylene glycol di(methyl, ethyl, or butyl) ether, propylene glycol mono(methyl, ethyl, or butyl) ether, dipropylene glycol mono(methyl or ethyl) ether, and tripropylene glycol monomethyl ether.

Examples of the ester include ethylene glycol mono (methyl, ethyl, or butyl) ether acetate, ethylene glycol di(methyl, ethyl, or butyl) ether acetate, diethylene glycol mono (methyl, ethyl, or butyl) ether acetate, diethylene glycol di(methyl, ethyl, or butyl) ether acetate, propylene glycol mono(methyl, ethyl, or butyl) ether acetate, dipropylene glycol mono(methyl or ethyl) ether acetate, tripropylene glycol monomethyl ether acetate, 2-(methoxy, ethoxy, or butoxy)ethyl acetate, 2-ethylhexyl acetate, dimethyl phthalate, diethyl phthalate, and butyl lactate. An example of the ketone is cyclohexanone.

In particular, diethylene glycol diethyl ether, tetraethylene glycol monobutyl ether, tetraethylene glycol dimethyl ether, ethylene glycol monobutyl ether acetate, and propylene glycol monomethyl ether acetate are preferably used.

Examples of the pigment used for preparing the solvent-based pigment ink are the same as those described above as examples of pigments that can be used for preparing the aqueous pigment ink.

The absorbing substrate according to the present invention can be particularly suitably used when printing is performed using the solvent-based pigment ink, which is selected from the aqueous pigment ink and the solvent-based pigment ink.

Printing may be performed on the absorbing substrate according to the present invention using the above-described pigment ink by any printing method. However, it is preferable to employ inkjet printing, screen printing, relief reverse printing, or gravure offset printing.

The absorbing substrate according to the present invention has good printability even when the fluid is a conductive ink including a conductive substance and enables fine lines having a width of about 0.01 µm to about 200 µm and preferably having a width of about 0.01 µm to about 150 µm, which are required in formation of a conductive pattern such as an electronic circuit, to be printed without causing bleeding (i.e., fine-line formability). Therefore, the absorbing substrate according to the present invention can also be suitably used in, for example, the field of printed electronics such as formation of an electronic circuit using a silver ink or the like, formation of layers constituting organic solar batteries, electronic book readers, organic ELs, organic transistors, flexible printed substrates, or RFIDs and their peripheral wires, and wires of electromagnetic shielding of a plasma display.

An absorbing substrate according to the present invention which can be used for forming the above-described conductive pattern (i.e., conductive-ink-absorbing substrate) includes an absorbing layer formed on a part or the entirety of the surface of a support using the absorbing-layer-forming composition as described above. The absorbing layer may be stacked on the support. Alternatively, the support may be impregnated with a part of the absorbing layer. The absorbing layer may be disposed on one or both surfaces of the support. The absorbing-layer-forming composition may be applied onto a part or the entirety of the surface of the support.

The absorbing substrate according to the present invention can be prepared by coating or impregnating a part or the entirety of one or both surfaces of the support with the absorbing-layer-forming composition and subsequently removing an aqueous medium (B) included in the conductive absorbing-layer-forming composition.

Examples of a support on which the absorbing layer can be suitably stacked in the preparation of the conductive pattern include supports composed of a polyimide resin, a polyamide-imide resin, a polyamide resin, polyethylene terephthalate, polyethylene naphthalate, polycarbonate, acrylonitrile-butadiene-styrene (ABS), an acrylic resin such as polymethyl(meth)acrylate, polyvinylidene fluoride, polyvinyl chloride, polyvinylidene chloride, polyvinyl alcohol, polycarbonate, polyethylene, polypropylene, polyurethane, cellulose nanofibers, silicon, a ceramic, or glass; porous supports composed of these materials; a steel sheet; and supports made of a metal such as copper.

In particular, it is preferable to use a support composed of a polyimide resin, polyethylene terephthalate, polyethylene naphthalate, glass, cellulose nanofibers, or the like, which is commonly used as a support in the formation of a conductive pattern such as a circuit board.

Among the above-described supports, substrates composed of a polyimide resin, polyethylene terephthalate, polyethylene naphthalate, polycarbonate, acrylonitrile-butadiene-styrene (ABS), an acrylic resin, glass, or the like generally have low adhesion. Accordingly, a resin and the like are less likely to adhere to these substrates.

In an application that requires flexibility or the like, the support preferably has a relatively high flexibility and is capable of, for example, being bent in order to enhance the flexibility of a conductive pattern and enable a bendable final product to be produced. Specifically, it is preferable to use a film-like support or a sheet-like support formed by, for example, uniaxial stretching.

Examples of the film-like or sheet-like support include a polyethylene terephthalate film, a polyimide film, and a polyethylene naphthalate film.

A part or the entirety of the surface of the support can be coated or impregnated with the absorbing-layer-forming composition by any publicly known method such as a gravure method, a coating method, a screen method, a roller method, a rotary method, a spray method, or an inkjet method.

After a part or the entirety of the surface of the support is coated or impregnated with the absorbing-layer-forming composition according to the present invention, an aqueous medium (B) that may be included in the composition can be removed generally by, for example, drying with a dryer. However, the method for removing the aqueous medium (B) is not particularly limited. The drying temperature may be set to any temperature that allows the solvent to be volatilized and does not adversely affect the support.

The amount of the absorbing-layer-forming composition deposited on the support is preferably 0.01 $g/m^2$ to 20 $g/m^2$ per area of the support in terms of resin solid content in consideration of, for example, the amount of the solvent included in the fluid such as a conductive ink and the thickness of the conductive pattern or the like and is particularly preferably 0.01 $g/m^2$ to 10 $g/m^2$ in consideration of capability of absorbing a solvent included in the fluid and the production cost.

Increasing the amount of the absorbing-layer-forming composition deposited on the surface of the support further enhances the fine-line formability of the absorbing substrate. However, when the amount of the composition deposited is increased, the feeling of the absorbing substrate may become slightly hard. Thus, in the case where high flexibility is required as in a bendable, flexible printed substrate and the like, the amount of the absorbing-layer-forming composition deposited on the support is preferably set relatively low, that is, about 0.02 g/m$^2$ to about 10 g/m$^2$. However, depending on the application or the like, the absorbing-layer-forming composition may be used so as to form a relatively thick film, that is, at about 10 g/m$^2$ to about 100 g/m$^2$.

The absorbing substrate according to the present invention prepared by the above-described method can be suitably used even when the fluid is a conductive ink and also suitably used mainly for, for example, forming a conductive pattern or the like in the field of printed electronics as described above. More specifically, the absorbing substrate can be suitably used as a substrate on which a circuit is formed in the production of electronic circuits, integrated circuits, or the like.

Printing can be performed on the above-described absorbing substrate or the above-described circuit-forming substrate using a conductive ink as a fluid. Specifically, printing is performed on the absorbing layer constituting the absorbing substrate using a conductive ink. Subsequently, a conductive pattern composed of a conductive substance included in the conductive ink, which is a metal such as a silver, is formed on the absorbing substrate through a firing process.

Similarly to the above-described pigment ink and the like, the conductive ink that can be used as a fluid is a liquid or a viscous liquid having a viscosity of 0.1 mPa·s to 500,000 mPa·s and preferably having a viscosity of 0.5 mPa·s to 10,000 mPa·s as measured using a Brookfield viscometer at about 25° C. which includes a solvent in which a conductive substance, a pigment, or the like is, for example, dispersed. In the case where printing or the like is performed using the fluid by inkjet printing, a fluid having a viscosity of 0.5 mPa·s to 10000 mPa·s is preferably used.

The conductive ink may include, for example, a conductive substance, a solvent, and, as needed, an additive such as a dispersing agent.

The conductive substance may be a transition metal or a compound of a transition metal. In particular, ionic transition metals are preferably used. For example, transition metals such as copper, silver, gold, nickel, palladium, platinum, and cobalt are preferably used. It is more preferable to use silver, gold, copper, or the like in order to form a conductive pattern having low electric resistance and high corrosion resistance.

The conductive substance preferably has a particle-like shape with an average particle diameter of about 1 nm to about 50 nm. The term "average particle diameter" used herein refers to the center particle diameter (D50) as measured by a laser diffraction/scattering particle size distribution analyzer.

The amount of the conductive substance such as a metal is preferably 10% by mass to 60% by mass of the total amount of the conductive ink.

The solvent included in the conductive ink may be any organic solvent or an aqueous medium such as water. The absorbing substrate according to the present invention can be suitably used in the case where a solvent-based conductive ink is used.

In the present invention, any one of a solvent-based conductive ink, which primarily includes an organic solvent serving as the solvent of the conductive ink described above; an aqueous conductive ink, which primarily includes water serving as the solvent; and a conductive ink including both organic solvent and water can be appropriately selected.

In particular, in order to enhance the fine-line formability, adhesion, and the like of a conductive pattern or the like to be formed, the conductive ink including both organic solvent and water as the solvents of the conductive ink described above and the solvent-based conductive ink, which primarily includes an organic solvent serving as the solvent of the conductive ink described above, are preferably used. More preferably, the solvent-based conductive ink, which primarily includes an organic solvent serving as the solvent of the conductive ink described above, is used.

In particular, the absorbing layer included in the absorbing substrate according to the present invention is preferably used in combination with a conductive ink mainly including a polar solvent serving as the organic solvent described above in order to limit the occurrence of bleeding, a reduction in adhesion, and the like which may be caused by the polar solvent to a sufficient degree and thereby achieve fine-line formability at a level comparable to that at which, for example, an increase in the density of electronic circuits or the like can be realized.

Examples of the solvent included in the solvent-based conductive ink include the following polar solvents: alcohol solvents such as methanol, n-propanol, isopropyl alcohol, n-butanol, isobutyl alcohol, sec-butanol, tert-butanol, heptanol, hexanol, octanol, nonanol, decanol, undecanol, dodecanol, tridecanol, tetradecanol, pentadecanol, stearyl alcohol, allyl alcohol, cyclohexanol, terpineol, terpineol, and dihydroterpineol; glycol solvents such as 2-ethyl-1,3-hexanediol, ethylene glycol, diethylene glycol, triethylene glycol, polyethylene glycol, propylene glycol, dipropylene glycol, 1,2-butanediol, 1,3-butanediol, 1,4-butanediol, and 2,3-butanediol; glycol ether solvents such as ethylene glycol monomethyl ether, ethylene glycol monoethyl ether, ethylene glycol monobutyl ether, diethylene glycol monoethyl ether, diethylene glycol monomethyl ether, diethylene glycol monobutyl ether, ethylene glycol monoethyl ether acetate, ethylene glycol monomethyl ether acetate, ethylene glycol monobutyl ether acetate, diethylene glycol monoethyl ether acetate, diethylene glycol monobutyl ether acetate, diethylene glycol diethyl ether, diethylene glycol dimethyl ether, diethylene glycol dibutyl ether, tetraethylene glycol dimethyl ether, tetraethylene glycol monobutyl ether, propylene glycol monomethyl ether, dipropylene glycol monomethyl ether, tripropylene glycol monomethyl ether, propylene glycol monopropyl ether, dipropylene glycol monopropyl ether, propylene glycol monobutyl ether, dipropylene glycol monobutyl ether, tripropylene glycol monobutyl ether, propylene glycol monomethyl ether acetate, dipropylene glycol monomethyl ether acetate, propylene glycol diacetate, propylene glycol phenyl ether, and dipropylene glycol dimethyl ether; and glycerin.

Among these polar solvents, solvents including a hydroxyl group are preferably used in order to prevent bleeding and the fine-line formability of the conductive pattern or the like from occurring and the conductive substance included in the conductive ink from being removed from the surface of the absorbing layer.

The solvent-based conductive ink may be used in combination with a ketone solvent such as acetone, cyclohexanone, or methyl ethyl ketone in order to control the physical properties thereof. In addition, the following nonpolar solvents may be used in combination as needed: ester solvents such as ethyl acetate, butyl acetate, 3-methoxybutyl acetate, and 3-methoxy-3-methyl-butyl acetate; hydrocarbon solvents such as toluene; and, in particular, hydrocarbon solvent having eight or more carbon atoms, such as octane, nonane, decane, dodecane, tridecane, tetradecane, cyclooctane, xylene, mesitylene, ethylbenzene, dodecylbenzene, tetralin, and trimethylbenzenecyclohexane. Furthermore, solvents such as mineral spirit and solvent naphtha, which are mixed solvents, may also be used in combination.

However, since the absorbing layer formed using the absorbing-layer-forming composition according to the present invention is particularly preferably used in combination with a conductive ink including a polar solvent, the amount of the nonpolar solvent is more preferably 0% by mass to 40% by mass of the total amount of the solvents included in the conductive ink.

Examples of the aqueous medium that can be used as a solvent of the conductive ink are the same as those that can be used as the above-described aqueous medium (B). The aqueous medium may be, for example, water alone or a mixed solution of water and a water-soluble solvent. Preferable examples of the water-soluble solvent include the following polar solvents: alcohols such as methyl alcohol, ethyl alcohol, isopropyl alcohol, ethyl carbitol, ethyl cellosolve, and butyl cellosolve; and N-methylpyrrolidone. These polar solvents prevent bleeding and the fine-line formability of a conductive pattern or the like from occurring and the conductive substance included in the conductive ink from being removed from the surface of the absorbing layer.

The amount of the solvent included in the conductive ink is preferably 40% by mass to 90% by mass of the total amount of the conductive ink. The amount of the polar solvent is preferably 40% by mass to 100% by mass of the total amount of the solvents.

The conductive ink may further include, in addition to the above-described metals and solvents, various types of additives as needed.

For example, a dispersing agent may be used as an additive in order to enhance the dispersibility of the metal in the solvent.

Examples of the dispersing agent include amine-based polymer dispersants such as polyethyleneimine and polyvinylpyrrolidone; hydrocarbon-based polymer dispersants having a carboxylic acid group in the molecule, such as polyacrylic acid and carboxymethylcellulose; and polymer dispersants including a polar group, such as polyvinyl alcohol, a styrene-maleic acid copolymer, an olefin-maleic acid copolymer, and a copolymer including a polyethyleneimine portion and a polyethylene-oxide portion per molecule. Note that, polyvinyl alcohol may be used as a dispersing agent even in the case where the solvent-based conductive ink is used.

Printing can be performed on the absorbing substrate or the like using the conductive ink by, for example, inkjet printing, screen printing, relief reverse printing, gravure offset printing, offset printing, spin coating, spray coating, bar coating, die coating, slit coating, roll coating, or dip coating.

An "inkjet printer" can be used in inkjet printing. Specific examples of the inkjet printer include Konica Minolta EB100, Konica Minolta XY100 (produced by Konica Minolta IJ Technologies, Inc.), Dimatix Materials Printer DMP-3000, and Dimatix Materials Printer DMP-2831 (produced by Fujifilm Corporation).

Screen printing is a method in which a conductive ink is applied onto the surface of the absorbing layer using a mesh-like screen plate. Specifically, a conductive pattern having a predetermined shape is printed using a screen plate made of a metal, which is commonly refers to "metal mesh", to form a conductive pattern having a predetermined shape.

Relief reverse printing is a method in which a conductive ink is applied to a blanket to form a conductive-ink-coated surface, and the ink-coated surface is then transferred to the absorbing layer.

The blanket is preferably a silicone blanket made of silicone.

Specifically, a conductive ink is applied to the blanket so as to form a layer composed of the conductive ink. A relief printing plate including a plate having a pattern corresponding to a predetermined pattern shape as needed is pressed against the layer composed of the conductive ink to transfer a portion of the conductive ink deposited on the blanket which is brought into contact with the relief printing plate onto the surface of the relief printing plate.

Subsequently, the blanket is brought into contact with the absorbing layer to transfer the other portion of the conductive ink which remains on the blanket onto the surface of the absorbing layer. Thus, a conductive pattern having a predetermined pattern can be formed by the above-described method.

Gravure offset printing is a method in which, for example, a blanket is pressed against the surface of an intaglio printing plate having a predetermined pattern shape with a groove portion filled with a conductive ink to transfer the conductive ink to the blanket and the conductive ink on the blanket is subsequently transferred to the absorbing layer.

Examples of the intaglio printing plate include a gravure plate and a glass intaglio plate formed by etching a glass plate.

The blanket may have a multilayer structure including a silicone rubber layer, a polyethylene terephthalate layer, a sponge-like layer, or the like. In general, these layers are wound around a rigid cylinder referred to as "blanket cylinder".

Bonding the conductive substances included in the conductive ink together imparts electrical conductivity to a printed item, which is produced by performing printing on the absorbing substrate by the above-described method.

The conductive substance can be bonded together by, for example, heat firing or light irradiation.

Firing is preferably performed at about 80° C. to about 300° C. for about 2 minutes to about 200 minutes. Firing may be performed in the atmosphere. Alternatively, a part or the entirety of the firing process may be conducted in a reducing atmosphere in order to prevent oxidation of the metal from occurring.

The firing process may be conducted using, for example, an oven, a hot-air drying oven, an infrared drying oven, laser irradiation, flashlamp irradiation, or microwave.

The firing temperature is preferably about 80° C. to about 300° C., is more preferably 100° C. to 300° C., and is particularly preferably 120° C. to 300° C. In the case where the support is relatively heat-labile, the upper temperature limit is preferably set to 200° C. or less and is more preferably set to 150° C. or less.

Through the above-described firing process, a conductive pattern composed of the metal included in the conductive ink is formed on the surface of the printed item. Such a conductive pattern can be used for producing circuit boards, integrated circuit boards, or the like of various types of electronic products or the like.

The conductive pattern may optionally be subjected to a plating process using a metal such as copper in order to form a high-reliability wire pattern capable of maintaining good electrical conductivity over a prolonged period of time without, for example, causing wires to be broken. A specific example of such a conductive pattern is a conductive pattern including an absorbing layer formed on a part or the entirety of the surface of the support using the absorbing-layer-forming composition and a plating film deposited on a part or the entirety of the surface of the absorbing layer. The plating film may be formed by, for example, applying a plating-core agent onto a part or the entirety of the surface of the absorbing layer so as to deposit a plating core thereon, followed by performing a firing process or the like as needed, and subsequently performing electrolytic plating, electroless plating, or electroless plating followed by electrolytic plating.

Examples of the plating-core agent are the same as the conductive inks described above as examples of the fluid. The plating-core agent may include a solvent in which a plating core, that is, specifically, a conductive substance, is, for example, dispersed.

Examples of the conductive substance included in the plating-core agent include the metal particles described above as examples of a conductive substance that can be included in the above-described conductive ink; an oxide of the metal; and metal particles coated with an organic substance. These conductive substances may be used alone or in combination of two or more.

Although the metal oxide is generally in an inactive (i.e., insulated) state, treating the metal oxide with a reductant such as dimethylaminoborane causes the metal to be exposed and thereby imparts activity (i.e., electrical conductivity) to the metal oxide.

The metal particles coated with an organic substance are, for example, metal particles formed by incorporating a metal into each of resin particles (i.e., organic substance) formed by an emulsion polymerization method or the like. Although these metal particles are generally in an inactive (i.e., insulated) state, removing the organic substance using a laser or the like causes a metal to be exposed and thereby enables activity (i.e., electrical conductivity) to be imparted to the metal particles.

The conductive substance included in the plating-core agent preferably has an average particle diameter of about 10 nm to about 1000 nm.

Examples of the solvent included in the plating-core agent may be the same as those described above as examples of a solvent that can be included in the above-described conductive ink, such as an aqueous medium or an organic solvent.

The above-described electroless plating process is a process in which an electroless plating solution is brought into contact with the surface of the absorbing substrate on which a plating core such as palladium or silver is deposited to cause a metal such as copper included in the electroless plating solution to be precipitated and thereby an electroless plating film, which is a metal coating film, is formed.

The electroless plating solution may include, for example, a conductive substance that is a metal such as copper, nickel, chromium, cobalt, or tin; a reductant; and a solvent such as an aqueous medium or an organic solvent.

Examples of the reductant include dimethylaminoborane, hypophosphorous acid, sodium hypophosphite, dimethylamineborane, hydrazine, formaldehyde, sodium borohydride, and phenols.

The electroless plating solution may include, as needed, the following organic acids as a complexing agent: monocarboxylic acids such as acetic acid and formic acid; dicarboxylic acids such as malonic acid, succinic acid, adipic acid, maleic acid, and fumaric acid; hydroxycarboxylic acids such as malic acid, lactic acid, glycolic acid, gluconic acid, and citric acid; amino acids such as glycine, alanine, iminodiacetic acid, arginine, asparagic acid, and glutamic acid; aminopolycarboxylic acids such as iminodiacetic acid, nitrilotriacetic acid, ethylenediaminediacetic acid, ethylenediaminetetraacetic acid, and diethylenetriaminepentaacetic acid. Examples of the complexing agent also include soluble salts (e.g., sodium salt, potassium salt, and ammonium salt) of the above-described organic acids and amines such as ethylenediamine, diethylenetriamine, and triethylenetetramine.

When the electroless plating solution is brought into contact with the surface of the absorbing substrate on which the plating core included in the plating-core agent is deposited, the temperature of the electroless plating solution is preferably set to about 20° C. to about 98° C.

The electrolytic plating process is a process in which a current is passed while a surface (x) of the absorbing substrate on which the plating core or the like is deposited or a surface (y) of an electroless plating film formed by the above-described electroless plating is in contact with the electrolytic plating solution to cause a metal such as copper included in the electrolytic plating solution to be precipitated on the surface (x) of the absorbing substrate or on the surface (y) of the electroless plating film formed by the above-described electroless plating, which is disposed as a negative electrode, in order to form an electrolytic plating film (i.e., metal coating film).

The electrolytic plating solution may include a conductive substance that is a metal such as copper, nickel, chromium, cobalt, or tin; sulfuric acid or the like; and an aqueous medium.

When the electrolytic plating solution is brought into contact with the surface of the absorbing substrate on which the plating core included in the plating-core agent is deposited, the temperature of the electrolytic plating solution is preferably set to about 20° C. to 98° C.

In the above-described electroless plating process and the electrolytic plating process, a highly acidic or highly alkaline plating solution is commonly used as described above. Accordingly, in the case where an ordinary absorbing substrate is used, the absorbing layer of the absorbing substrate may be affected, which results in peeling of the absorbing layer from the support in many cases.

On the other hand, when printing is performed on the absorbing substrate according to the present invention using a fluid such as a plating-core agent and subsequently a crosslinked structure is formed in the above-described absorbing layer, peeling of the absorbing layer from the support does not occur in the above-described plating process. In particular, even when the support is composed of a polyimide resin or the like, peeling of the absorbing layer does not occur. Therefore, the absorbing-layer-forming composition can be highly suitably used for producing the above-described conductive pattern.

The above-described conductive pattern can be suitably used for, for example, forming electronic circuits using a silver ink or the like; forming layers constituting organic solar batteries, electronic book readers, organic ELs, organic transistors, flexible printed substrates, RFIDs, or the like and their peripheral wires; and forming conductive patterns, that is, more specifically, circuit boards, used for manufacturing wires or the like of electromagnetic shielding of a plasma display.

A conductive pattern produced by the above-described method which includes a crosslinked structure formed in the absorbing layer subsequent to printing using a fluid such as a conductive ink or a plating-core agent has markedly high durability such that good electrical conductivity can be maintained without, for example, causing the absorbing layer to be peeled off from the support even after plating. Thus, such a conductive pattern can be suitably used in the following applications when particularly high durability is required: formation of circuit-forming substrates used for producing electronic circuits, integrated circuits, and the like using a silver ink or the like; formation of layers constituting organic solar batteries, electronic book readers, organic ELs, organic transistors, flexible printed substrates, and RFIDs and their peripheral wires; and wires of electromagnetic shielding of a plasma display. In particular, such a conductive pattern that has been subjected to the above-described plating process, which enables a high-reliability wire pattern capable of maintaining good electrical conductivity over a prolonged period of time without, for example, causing wires to be broken, to be formed, is commonly referred to as "copper clad laminate (CCL)", which can be used in the applications of flexible printed substrates (FPC), tape automated bonding (TAB), chip-on films (COF), printed wire boards (PWB), and the like.

EXAMPLES

The present invention is described below with reference to Examples.

Example 1

In a nitrogen-purged reaction container equipped with a thermometer, a nitrogen-gas-introduction tube, and a stirrer, 6.3 parts by mass of 2,2-dimethylolpropionic acid was reacted with 71.1 parts by mass of an isocyanurate of 4,4'-diphenylmethane diisocyanate in methyl ethyl ketone to prepare an isocyanate compound. Subsequently, 17.8 parts by mass of phenol, which served as a blocking agent, was charged into the reaction container to cause a reaction. Thus, a solvent solution of a blocked polyisocyanate (A-1) was prepared.

To the solvent solution of a blocked polyisocyanate (A-1), 4.8 parts by mass of triethylamine was added to neutralize some or all of the carboxyl groups included in the blocked polyisocyanate (A-1). Subsequently, 400 parts by mass of water was added to the solution. After the solution was stirred to a sufficient degree, methyl ethyl ketone was distilled off from the solution to prepare an absorbing-layer-forming composition (solid content: 20% by mass), which included the blocked polyisocyanate (A-1) and water.

Example 2

In a nitrogen-purged reaction container equipped with a thermometer, a nitrogen-gas-introduction tube, and a stirrer, 6.1 parts by mass of 2,2-dimethylolpropionic acid was reacted with 2.8 parts by mass of ethylene glycol and 70.8 parts by mass of an isocyanurate of tolylene diisocyanate in methyl ethyl ketone to prepare an isocyanate compound. Subsequently, 15.7 parts by mass of methyl ethyl ketone oxime, which served as a blocking agent, was charged into the reaction container to cause a reaction. Thus, a solvent solution of a blocked polyisocyanate (A-2) was prepared.

To the solvent solution of a blocked polyisocyanate (A-2), 4.6 parts by mass of triethylamine was added to neutralize some or all of the carboxyl groups included in the blocked polyisocyanate (A-2). Subsequently, 400 parts by mass of water was added to the solution. After the solution was stirred to a sufficient degree, methyl ethyl ketone was distilled off from the solution to prepare an absorbing-layer-forming composition (solid content: 20% by mass), which included the blocked polyisocyanate (A-2) and water.

Example 3

In a nitrogen-purged reaction container equipped with a thermometer, a nitrogen-gas-introduction tube, and a stirrer, 8.2 parts by mass of 2,2-dimethylolpropionic acid was reacted with 64.2 parts by mass of an isocyanurate of tolylene diisocyanate in methyl ethyl ketone to prepare an isocyanate compound. Subsequently, 21.4 parts by mass of methyl ethyl ketone oxime, which served as a blocking agent, was charged into the reaction container to cause a reaction. Thus, a solvent solution of a blocked polyisocyanate (A-3) was prepared.

To the solvent solution of a blocked polyisocyanate (A-3), 6.2 parts by mass of triethylamine was added to neutralize some or all of the carboxyl groups included in the blocked polyisocyanate (A-3). Subsequently, 400 parts by mass of water was added to the solution. After the solution was stirred to a sufficient degree, methyl ethyl ketone was distilled off from the solution to prepare an absorbing-layer-forming composition (solid content: 20% by mass), which included the blocked polyisocyanate (A-3) and water.

Example 4

In a nitrogen-purged reaction container equipped with a thermometer, a nitrogen-gas-introduction tube, and a stirrer, 5.6 parts by mass of 2,2-dimethylolpropionic acid was reacted with 3.7 parts by mass of 1,4-butanediol and 62.9 parts by mass of an isocyanurate of hexamethylene diisocyanate in methyl ethyl ketone to prepare an isocyanate compound. Subsequently, 23.5 parts by mass of ε-caprolactam, which served as a blocking agent, was charged into the reaction container to cause a reaction. Thus, a solvent solution of a blocked polyisocyanate (A-4) was prepared.

To the solvent solution of a blocked polyisocyanate (A-4), 4.2 parts by mass of triethylamine was added to neutralize some or all of the carboxyl groups included in the blocked polyisocyanate (A-4). Subsequently, 400 parts by mass of water was added to the solution. After the solution was stirred to a sufficient degree, methyl ethyl ketone was distilled off from the solution to prepare an absorbing-layer-forming composition (solid content: 20% by mass), which included the blocked polyisocyanate (A-4) and water.

Example 5

In a nitrogen-purged reaction container equipped with a thermometer, a nitrogen-gas-introduction tube, and a stirrer, 41.8 parts by mass of polyethylene glycol having a number-average molecular weight of 1000 was reacted with 42.2 parts by mass of an isocyanurate of hexamethylene diisocyanate in methyl ethyl ketone to prepare an isocyanate compound. Subsequently, 16.1 parts by mass of 3,5-dimethylpyrazole, which served as a blocking agent, was charged into the reaction container to cause a reaction. Thus, a solvent solution of a blocked polyisocyanate (A-5) was prepared.

To the solvent solution of a blocked polyisocyanate (A-5), 400 parts by mass of water was added. After the solution was stirred to a sufficient degree, methyl ethyl ketone was distilled off from the solution to prepare an absorbing-layerforming composition (solid content: 20% by mass), which included the blocked polyisocyanate (A-5) and water.

Example 6

In a nitrogen-purged reaction container equipped with a thermometer, a nitrogen-gas-introduction tube, and a stirrer, 6.3 parts by mass of 2,2-dimethylolpropionic acid was reacted with 71.1 parts by mass of an isocyanurate of 4,4'-diphenylmethane diisocyanate in methyl ethyl ketone to prepare an isocyanate compound. Subsequently, 17.8 parts by mass of phenol, which served as a blocking agent, was charged into the reaction container to cause a reaction. Thus, a solvent solution of a blocked polyisocyanate (A-6) was prepared. Subsequently, methyl ethyl ketone was charged into the reaction container in order to control the solid content of the solvent solution. Thus, an absorbing-layer-forming composition (solid content: 20% by mass), which included the blocked polyisocyanate (A-6) and methyl ethyl ketone, was prepared.

Comparative Example 1

SUPERFLEX 150 (latex, produced by DKS Co. Ltd.) was used as an absorbing-layer-forming composition.
[Method for Preparing Absorbing Substrate]

The absorbing-layer-forming compositions described in Examples and Comparative Example were each applied onto the surface of a polyimide film (Kapton200H produced by DU PONT-TORAY CO., LTD., thickness: 50 μm) using a bar coater so that the resulting coating film had a thickness of 0.1 μm after being dried. Subsequently, drying was performed using a hot-air dryer at 70° C. for 3 minutes. Thus, absorbing substrates each including an absorbing layer disposed on the surface of the polyimide film were prepared.
[Method for Preparing Conductive Ink 1 Serving as Fluid]

A chloroform (30 ml) solution containing 9.6 g of p-toluenesulfonic acid chloride was added dropwise into a mixture including 20 g of methoxy polyethylene glycol (number-average molecular weight: 2,000), 8.0 g of pyridine, and 20 ml of chloroform over 30 minutes in a nitrogen atmosphere under ice cooling and stirring. After being stirred for 4 hours with a bath temperature of 40° C., the resulting mixture was mixed with 50 ml of chloroform.

The above product was washed with 100 ml of a 5-mass % aqueous hydrochloric acid solution, subsequently washed with 100 ml of a saturated aqueous sodium hydrogencarbonate solution, and then washed with 100 ml of a saturated saline solution. The product was dried using anhydrous magnesium sulfate, subsequently subjected to filtration and vacuum concentration, then washed with hexane several times, and subjected to filtration and vacuum drying at 80° C. Thus, methoxypolyethylene glycol including a p-toluenesulfonyloxy group was prepared.

Then, 5.39 g of methoxypolyethylene glycol including a p-toluenesulfonyloxy group was mixed with 20 g of polyethyleneimine (produced by Aldrich Corporation, molecular weight: 25,000), 0.07 g of potassium carbonate, and 100 ml of N,N-dimethylacetamide. The resulting mixture was stirred at 100° C. for 6 hours in a nitrogen atmosphere.

To the mixture, 300 ml of a mixed solution of ethyl acetate and hexane (volume ratio of ethyl acetate/hexane=1/2) was added. After the mixture was vigorously stirred at room temperature, the solid component included in the product was filtered off. The solid component was washed with 100 ml of a mixed solution of ethyl acetate and hexane (volume ratio of ethyl acetate/hexane=1/2) and then subjected to vacuum drying. Thus, a compound in which polyethylene glycol was bonded to polyethyleneimine was prepared.

Subsequently, 138.8 g of an aqueous solution including 0.592 g of the compound in which polyethylene glycol was bonded to polyethyleneimine was mixed with 10 g of silver oxide, and the resulting mixture was stirred at 25° C. for 30 minutes.

To the mixture, 46 g of dimethylethanolamine was gradually added under stirring. Then, the mixture was stirred at 25° C. for 30 minutes.

To the mixture, 15.2 g of a 10-mass % aqueous ascorbic acid solution was gradually added under stirring. Stirring was continued for 20 hours. Thus, a silver-containing dispersion was prepared.

To the silver-containing dispersion, a mixed solvent of 200 ml of isopropyl alcohol and 200 ml of hexane was added. The resulting mixture was stirred for 2 minutes and subsequently subjected to centrifugal concentration at 3000 rpm for 5 minutes. After the supernatant was removed, a mixed solvent of 50 ml of isopropyl alcohol and 50 ml of hexane was added to the precipitate. After being stirred for 2 minutes, the resulting mixture was subjected to centrifugal concentration at 3000 rpm for 5 minutes. After the supernatant was removed, 20 g of water was further added to the precipitate. After the resulting mixture was stirred for 2 minutes, the organic solvent was removed from the mixture under a reduced pressure. Then, 10 g of water was further added to the mixture. The mixture was stirred so as to form a dispersion. The dispersion was left standing in a refrigeration machine kept at −40° C. for a whole day and night and thereby frozen. The frozen dispersion was subjected to a treatment using a freeze dryer (FDU-2200 produced by TOKYO RIKAKIKAI CO, LTD) for 24 hours. Thus, a silver-containing powder composed of flaky blocks having a greenish gray, metallic luster was prepared.

The silver-containing powder (25.9 g) prepared above was mixed with 45 g of ethylene glycol and 55 g of ion-exchange water, and the resulting mixture was stirred for 3 hours. Thus, a conductive ink 1 capable of serving as a conductive ink for inkjet printing was prepared (silver content: 20% by mass, mass proportion of polyethyleneimine: 1% by mass, viscosity: 10 mPa·s).
[Printing Method Using Inkjet Printing]

A straight line having a length of about 1 cm, a width of 100 μm, and a film thickness of 0.5 μm was printed on the surface of each absorbing substrate using the conductive ink 1 with an inkjet printer (inkjet tester EB100 produced by Konica Minolta IJ Technologies, Inc., evaluation printer head: KM512L, discharge rate: 42 pl). Subsequently, drying was performed at 200° C. for 30 minutes to prepare a printed item 1.

A straight line having a length of about 1 cm, a width of 1 mm, and a film thickness of 0.5 μm was also printed on the surface of each absorbing substrate using the conductive ink 1 with the same inkjet printer as that described above. Subsequently, drying was performed at 200° C. for 30 minutes to prepare a printed item 2.
[Method for Evaluating Fine-Line Formability]

The pattern (i.e., printed portion) having a line width of 100 μm, which was formed on the surface of each printed item 1 by the above-described method, was observed using an optical microscope (Digital Microscope VHX-100 produced by Keyence Corporation) in order to determine the presence or absence of bleeding that occurred on the printed portion.

Specifically, an evaluation was made in accordance with the following criteria: an evaluation of "A" was given when occurrence of bleeding was not confirmed at the outer periphery of the line-printed portion, the boundary between the printed portion and the non-printed portion was clear, and no difference in height between the outer periphery and the center of the printed portion was confirmed, that is, the entirety of the printed portion was substantially flat and smooth; an evaluation of "B" was given when the boundary between the printed portion and the non-printed portion was substantially clear all over the entire surface and the entirety of the printed portion was substantially flat and smooth although a small amount of bleeding that occurred at only a small portion of the outer periphery of the printed portion was confirmed; an evaluation of "C" was given when the entirety of the line portion was substantially flat and smooth and still at a practical level although a small amount of bleeding that occurred at about 1/3 or less of the outer periphery of the printed portion (i.e., line portion) was confirmed and the boundary between the printed portion and the non-printed portion was partially unclear in the portion in which occurrence of bleeding was confirmed; an evaluation of "D" was given when bleeding that occurred at about 1/3 to about 1/2 of the outer periphery of the printed portion (i.e., line portion) was confirmed, the boundary between the printed portion and the non-printed portion was partially unclear in the portion in which occurrence of bleeding was confirmed, and a difference in height between the outer periphery and the center of the line portion was confirmed; and an evaluation of "E" was given when bleeding that occurred at about 1/2 or more of the outer periphery of the printed portion (i.e., line portion) was confirmed, the boundary between the printed portion and the non-printed portion was partially unclear in the portion in which occurrence of bleeding was confirmed, and a difference in height between the outer periphery and the center of the line portion was confirmed.

[Method for Evaluating Adhesion]

A cellophane adhesive tape (CT405AP-24 produced by Nichiban Co., Ltd., 24 mm) was affixed to the pattern (i.e., printed portion) formed on the surface of each printed item 2 by pressing by hand. Subsequently, the cellophane adhesive tape was peeled off in a direction inclined at 90 degrees with respect to the surface of the printed item 2. The adhesive surface of the cellophane adhesive tape was visually inspected, and adhesion was evaluated on the basis of the presence or absence of an attachment.

The evaluation was made in accordance with the following criteria: an evaluation of "A" was given when silver included in the conductive ink and the absorbing layer were not adhered onto the adhesive surface of the peeled cellophane adhesive tape; an evaluation of "B" was given when the silver and the absorbing layer were peeled off from the support and adhered to the adhesive tape in less than about 5% of the region to which the adhesive tape was affixed; an evaluation of "C" was given when the silver and the absorbing layer were peeled off from the support and adhered to the adhesive tape in about 5% or more and less than 50% of the region to which the adhesive tape was affixed; and an evaluation of "D" was given when the silver and the absorbing layer were peeled off from the support and adhered to the adhesive tape in about 50% or more of the region to which the adhesive tape was affixed.

[Method for Performing Electroless Plating on Nano-Silver Printed Item]

An activator (Ace Clean A220 produced by Okuno Chemical Industries Co., Ltd.) was applied to the pattern (i.e., printed portion) formed on the surface of each printed item 2 prepared above. Then, a plating-core-activation treatment was performed at 55° C. for 5 minutes.

Subsequently, an electroless copper plating agent (OPC-750 produced by Okuno Chemical Industries Co., Ltd.) was applied onto the surface of the printed item 2, which had been subjected to the activation treatment. Then, an electroless copper plating was performed at 20° C. for 20 minutes.

Thus, a conductive pattern including a copper plating film deposited on the surface of the printed item 2, on which the plating core was disposed, was prepared. The copper plating films of the conductive patterns used for evaluating adhesion had a thickness of 8 μm.

[Method for Performing Electrolytic Plating on Nano-Silver Printed Item]

Electrolytic plating was performed for 15 minutes at a current density of 2 A/dm2 using the pattern (i.e., printed portion) formed on the surface of each printed item 2 prepared above as a cathode and phosphorus-containing copper as an anode with an electrolytic plating solution containing copper sulfate. Thus, a conductive pattern including a copper plating layer having a thickness of 8 μm deposited on the surface of the printed item 2 was prepared. The electrolytic plating solution included 70 g/L of copper sulfate, 200 g/L of sulfuric acid, 50 mg/L of chlorine ions, and 5 g/L of Top Lucina SF (brightener produced by Okuno Chemical Industries Co., Ltd.).

[Evaluation by Peel Test]

The peel strength of each conductive pattern including the plating layer was measured by a method conforming to IPC-TM-650, NUMBER2.4.9. The width of a lead used for the measurement was 1 mm, and a peeling angle was set to 90°. The larger the thickness of the plating layer, the higher the peel strength. Thus, in the present invention, an evaluation of peeling strength was made with reference to a peeling strength measured when the thickness of the plating layer was 8 μm, which is commonly employed at present.

TABLE 1

|  |  | Example 1 | Example 2 | Example 3 | Example 4 | Example 5 | Example 6 |
|---|---|---|---|---|---|---|---|
| Absorbing-layer-forming composition |  | A-1 | A-2 | A-3 | A-4 | A-5 | A-6 |
| 2,2-Dimethylolpropionic acid | Parts by mass | 6.3 | 6.1 | 8.2 | 5.6 | — | 6.3 |
| Polyethylene glycol (molecular weight: 1,000) |  | — | — | — | — | 41.8 | — |
| Ethylene glycol |  | — | 2.8 | — | — | — | — |
| 1,4-Butanediol |  | — | — | — | 3.7 | — | — |
| MDI nurate |  | 71.1 | — | — | — | — | 71.1 |
| TDI nurate |  | — | 70.8 | 64.2 | — | — | — |
| HDI nurate |  | — | — | — | 62.9 | 42.2 | — |
| Phenol |  | 17.8 | — | — | — | — | 17.8 |

TABLE 1-continued

|  | Example 1 | Example 2 | Example 3 | Example 4 | Example 5 | Example 6 |
| --- | --- | --- | --- | --- | --- | --- |
| Methyl ethyl ketone oxime | — | 15.7 | 21.4 | — | — | — |
| ε-Caprolactam | — | — | — | 23.5 | — | — |
| 3,5-Dimethylpyrazole | — | — | — | — | 16.1 | — |
| Triethylamine | 4.8 | 4.6 | 6.2 | 4.2 | — | — |
| Fine-line formability | A | A | A | A | A | A |
| Adhesion of printed item 2 before plating | A | A | A | A | A | A |
| Adhesion of conductive pattern after electroless plating (N/m) | 400 | 390 | 380 | 300 | 230 | 390 |
| Adhesion of conductive pattern after electrolytic plating (N/m) | 460 | 410 | 380 | 340 | 230 | 400 |

In Table 1, "MDI nurate" represents an isocyanurate of 4,4'-diphenylmethane diisocyanate, "TDI nurate" represents an isocyanurate of tolylene diisocyanate, and "HDI nurate" represents an isocyanurate of hexamethylene diisocyanate.

TABLE 2

|  | Comparative Example 1 |
| --- | --- |
| Absorbing-layer-forming composition | SUPERFLEX 150 |
| Fine-line formability | D |
| Adhesion of printed item 2 before plating | C |
| Adhesion of conductive pattern after electroless plating (N/m) | 30 |
| Adhesion of conductive pattern after electrolytic plating (N/m) | 20 |

SUPERFLEX 150: Latex produced by DKS Co. Ltd.

The invention claimed is:

1. A conductive pattern comprising:
    an absorbing substrate comprising a support and an absorbing layer disposed on a part or the entirety of a surface of the support; and
    a patterned conductive layer on the absorbing layer, wherein
    the absorbing layer comprises an absorbing-layer-forming composition including a blocked isocyanate (A), an amount of the blocked isocyanate (A) is 50% by mass to 100% by mass of the solid content of the absorbing-layer-forming composition.

2. The conductive pattern according to claim 1, further comprising electrolytic plating or electroless plating on a surface of the patterned conductive layer.

3. The conductive pattern according to claim 1, wherein the patterned conductive layer is printed on the absorbing layer of the absorbing substrate using a conductive ink including a conductive substance or using a fluid including a plating-core agent including a conductive substance.

4. The conductive pattern according to claim 1, further comprising electrolytic plating or electroless plating on a surface of the patterned conductive layer formed by performing printing using the fluid.

* * * * *